United States Patent
Ning et al.

(10) Patent No.: US 8,895,211 B2
(45) Date of Patent: Nov. 25, 2014

(54) SEMICONDUCTOR DEVICE RESOLUTION ENHANCEMENT BY ETCHING MULTIPLE SIDES OF A MASK

(71) Applicant: GLOBALFOUNDRIES, Inc., Grand Cayman (KY)

(72) Inventors: Guoxiang Ning, Clifton Park, NY (US); Chunyu Wong, Ballston Lake, NY (US); Paul Ackmann, Gansevoort, NY (US); Sarasvathi Thangaraju, Malta, NY (US)

(73) Assignee: GLOBALFOUNDRIES, Inc., Santa Clara, CA (US)

( * ) Notice: Subject to any disclaimer, the term of this patent is extended or adjusted under 35 U.S.C. 154(b) by 58 days.

(21) Appl. No.: 13/710,498

(22) Filed: Dec. 11, 2012

(65) Prior Publication Data

US 2014/0162176 A1    Jun. 12, 2014

(51) Int. Cl.
*G03F 1/26*    (2012.01)

(52) U.S. Cl.
CPC ........................ *G03F 1/26* (2013.01)
USPC ................................. 430/5; 430/394

(58) Field of Classification Search
USPC ....................... 430/5, 322, 323, 394
See application file for complete search history.

(56) References Cited

U.S. PATENT DOCUMENTS

| | | | |
|---|---|---|---|
| 6,503,666 B1 | 1/2003 | Pierrat | |
| 6,866,968 B2 * | 3/2005 | Shin et al. | 430/5 |
| 7,749,662 B2 | 7/2010 | Matthew et al. | |
| 7,851,136 B2 | 12/2010 | Levinson et al. | |
| 8,010,915 B2 | 8/2011 | Chen et al. | |
| 8,021,805 B2 * | 9/2011 | Oh et al. | 430/5 |
| 8,057,968 B2 | 11/2011 | Tan et al. | |
| 2012/0001330 A1 | 1/2012 | Huisinga et al. | |
| 2012/0156865 A1 | 6/2012 | Thees et al. | |
| 2012/0205806 A1 | 8/2012 | Yelehanka et al. | |
| 2012/0241901 A1 | 9/2012 | Kotlanka et al. | |

OTHER PUBLICATIONS

FDTD Solutions Knowledge Base, Alternating Phase Shift Mask, http://docs.lumerical.com/en/fdtd/lith_alternating_phase_shift_mask.html, Copyright 2003-2012, 2 pgs.

* cited by examiner

*Primary Examiner* — Stephen Rosasco
(74) *Attorney, Agent, or Firm* — Matthew M. Hulihan, Esq.; Heslin Rothenberg Farley & Mesiti P.C.

(57) ABSTRACT

A mask is disclosed which includes a plurality of first phase shift regions disposed on a first side of the mask, and a plurality of second phase shift regions disposed on a second side of the mask. The first phase shift regions and second phase shift regions may be alternating phase shift regions in which phase shift of the first phase shift regions is out of phase, for instance by 180 degrees, from phase shift of the second phase shift regions. A method for forming the mask, and a semiconductor device fabrication method using the mask is also disclosed.

17 Claims, 4 Drawing Sheets

SEMICONDUCTOR DEVICE RESOLUTION ENHANCEMENT BY ETCHING MULTIPLE SIDES OF A MASK

BACKGROUND OF THE INVENTION

In semiconductor device manufacturing, three-dimensional (3D) integration can be achieved, for instance, using through-substrate vias (TSVs) for chip stacking. Connecting vias between the first metal (for instance copper) layer and the contact layer is one useful method for achieving such integration, especially for 20 nm technology and beyond. There is a desire to achieve minimum pitch and minimum Critical Dimension (CD) for these connecting vias to create as many possible connections between the contact and first metal layers. Current practices for forming tightly packed connecting vias uses two reticles in a double pattern process, in order to achieve the desired points of connectivity between the metal and TSV layers.

What is needed is a better facility for providing resolution enhancement for increased via connection coverage in semiconductor devices. One particularly useful application for this is in maximizing via connection coverage area on top of through-substrate vias (TSVs) of a semiconductor device.

BRIEF SUMMARY

The shortcomings of the prior art are overcome and additional advantages are provided through the provision of a mask including a plurality of first phase shift regions disposed on a first side of the mask; and a plurality of second phase shift regions disposed on a second side of the mask.

Additionally, a method is provided which includes, for instance, forming a plurality of first phase shift regions disposed on a first side of a mask; and forming a plurality of second phase shift regions disposed on a second side of the mask.

Further, a semiconductor device fabrication method is provided which includes fabricating a plurality of vias in a semiconductor device, the fabricating including obtaining a mask which includes, for instance, a plurality of first phase shift regions disposed on a first side of the mask, and a plurality of second phase shift regions disposed on a second side of the mask; and subjecting the mask to an exposure of electromagnetic radiation, said exposure operative for printing said plurality of vias onto a substrate of said semiconductor device.

Additional features and advantages are realized through the concepts of the present invention. Other embodiments and aspects of the invention are described in detail herein and are considered a part of the claimed invention.

BRIEF DESCRIPTION OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

The semiconductor or integrated circuit (IC) industry aims to manufacture ICs with higher and higher densities of devices on a smaller chip area to achieve greater functionality and to reduce manufacturing costs. This desire for large scale integration has led to a continued shrinking of circuit dimensions and device features. The ability to reduce the size of such features is driven by performance enhancements in the lithographic process by which integrated circuit (IC) structures are formed on a wafer. This process is also referred to as photolithography, or simply lithography. As is well known, lithographic processes can be used to transfer a pattern of a photomask (i.e. "mask", also referred interchangeably herein as a "reticle") to a wafer.

In one example, patterns are formed from a photoresist layer disposed on the wafer by passing radiation energy through a mask having an arrangement to image the desired pattern onto the photoresist layer. As a result, the pattern is transferred to the photoresist layer. In areas where the photoresist is sufficiently exposed, and after a development cycle, the photoresist material can become soluble such that it can be removed to selectively expose an underlying layer (e.g., a semiconductor layer, a metal or metal containing layer, a dielectric layer, a hard mask layer, etc.). Portions of the photoresist layer not exposed to a threshold amount of radiation energy will not be removed, and will serve to protect the underlying layer during further processing of the wafer (e.g., etching exposed portions of the underlying layer, implanting ions into the wafer, etc.). Thereafter, the remaining portions of the photoresist layer can be removed. Although the above refers to a positive resist process, negative resist processes can also be utilized to pattern a photoresist layer. Further details of a lithographic process are described below in connection with the lithographic system of FIG. 1.

Figure 1:
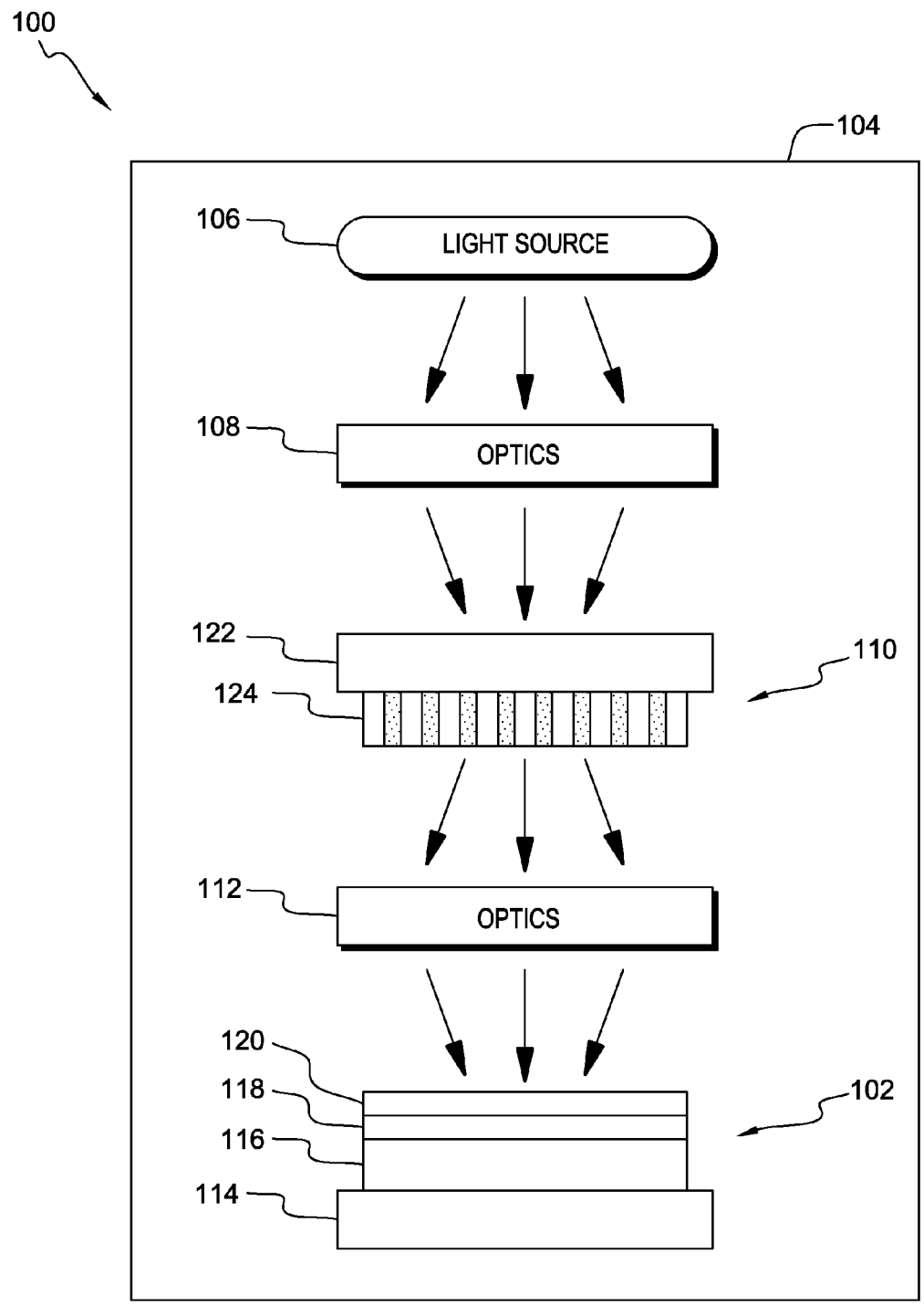
FIG. 1 is a schematic representation of one example of a lithographic system.

The lithographic system 100 of FIG. 1 is suitable for use in patterning a wafer 102. Lithographic system 100 includes a chamber 104, a radiation source 106 (typically a light source), a condenser lens assembly 108 (labeled "OPTICS" in FIG. 1), a mask or a reticle 110, an objective lens assembly 112 (labeled "OPTICS" in FIG. 1), and a stage 114. Lithographic system 100 is configured to transfer a pattern or image provided on mask 110 to a target material or surface of wafer 102.

Wafer 102 includes a substrate 116, a layer 118, and a photoresist layer 120. Photoresist layer 120 is disposed over layer 118, and layer 118 is disposed over substrate 116. Wafer 102, as depicted in FIG. 1, can be an entire semiconductor wafer or a portion thereof. Substrate 116 can be a semiconductor substrate, such as silicon, gallium arsenide, germanium, or any suitable substrate material. Substrate 116 can include one or more layers of material and/or features, such as lines, interconnects, vias, doped regions, or the like, and substrate 116 can further include devices or portions thereof, such as transistors, microactuators, microsensors, capacitors, resistors, diodes, or the like.

Layer 118 can be an insulative layer, a conductive layer, a barrier layer, or any target material to be etched, doped, treated, processed, or layered. In certain embodiments, layer 118 is a hard mask layer, such as a silicon nitride layer or a metal layer. The hard mask layer can serve as a patterned layer for processing substrate 116 or for processing a layer upon substrate 116. In yet another embodiment, layer 118 is an anti-reflective coating (ARC). Substrate 116 and layer 118 are not described in a limiting fashion, and can each include a conductive, semiconductive, or insulative material.

Photoresist layer 120 can include a variety of photoresist materials, compositions, or chemicals suitable for lithographic applications. Photoresist layer 120 is selected to have photochemical reactions in response to electromagnetic radiation (also referred to herein as 'light') emitted from radiation source 106 and to have sufficient transparency to the electromagnetic radiation to allow useful patterning of the photoresist layer. Materials including photoresist layer 120 can include, among others, a matrix material or resin, a sensitizer or inhibitor, and a solvent. Photoresist layer 120 may be a chemically amplified, positive or negative tone, organic-based photoresist. Photoresist layer 120 may also be a silicon-containing photoresist. Photoresist layer 120 may be, but is not limited to, an acrylate-based polymer, an alicyclic-based polymer, or a phenolic-based polymer.

Photoresist layer 120 is formed over the target material or layer of wafer 102 using any suitable technique, for example, deposition by spin coating over layer 118. The thickness of photoresist layer 120 is selected according to the particular lithographic technology, e.g., for use in vacuum ultraviolet (VUV) lithography, deep ultraviolet (DUV) lithography, and/or extreme ultraviolet (EUV) lithography (using, for example, exposing radiation having a wavelength of 193 nm, 157 nm, 126 nm, or 13.4 nm). In this regard, photoresist layer 120 may have a thickness in the range of 15-1000 nm.

Radiation source 106 provides electromagnetic radiation through condenser lens assembly 108, mask 110, and objective lens assembly 112 to photoresist layer 120. In one embodiment, radiation source 106 may be an excimer laser that produces radiation having a wavelength of 248 nm, 193 nm, 172 nm, 157 nm, or 126 nm, or a soft x-ray source that produces radiation having a wavelength of 13.4 nm. Alternatively, radiation source 106 may be any suitably configured radiation source capable of emitting radiation having a wavelength in the ultraviolet (UV), VUV, DUV, EUV, or x-ray range. Alternatively, the system may utilize a suitably configured electron/ion beam source.

Assemblies 108 and 112 include lenses, mirrors, collimators, beam splitters, and/or other optical components to suitably focus and direct a pattern of radiation (i.e., radiation from radiation source 106 as modified by a pattern or image provided on mask 110) onto photoresist layer 120. Stage 114 supports wafer 102 and can move wafer 102 relative to assembly 112.

Mask 110 is a binary mask in one embodiment. Mask 110 includes a transparent or translucent substrate 122 (e.g., glass or quartz) and an opaque or patterned layer 124 (which may be formed from chromium or chromium oxide, as examples) thereon. Opaque layer 124 provides a pattern or image associated with a desired circuit pattern, features, or devices to be projected onto photoresist layer 120. In one embodiment, mask 110 is an alternating phase shift mask, or other type of mask.

As light waves from light source 106 pass to mask 110, light incident upon the translucent areas of the mask will pass through the mask, while light incident on the opaque areas will be blocked. Light passing through the mask exposes portions of the photoresist layer 120 of the wafer 121.

There is a pervasive trend in the art of IC fabrication to increase the density with which various structures are arranged. For example, feature size, line width, and the separation between features and lines are becoming increasingly smaller. Yield is affected by factors such as mask pattern fidelity, optical proximity effects, and photoresist processing.

Resolution enhancement is provided herein in accordance with aspects of the present invention. One particularly useful application for resolution enhancement is the via connection area on top of through-substrate vias (TSVs). TSVs are relatively large—typically about 6 microns on top, with the dip being a few hundred microns. While a single solid metal connection on the top of the TSV would provide the best connectivity, that approach does not work. Instead, a two-dimensional (2D) array of thinner vias (for instance about 45 nm each) leading to the TSV is formed for connectivity with the upper layer(s) of the device. The vias in the 2D array of vias should be as compact as possible (i.e. have a closest possible pitch) to increase the number of vias formed on top of the TSV, thereby increasing the contact area and lowering resistance while avoiding stress-induced void.

Figure 2A:
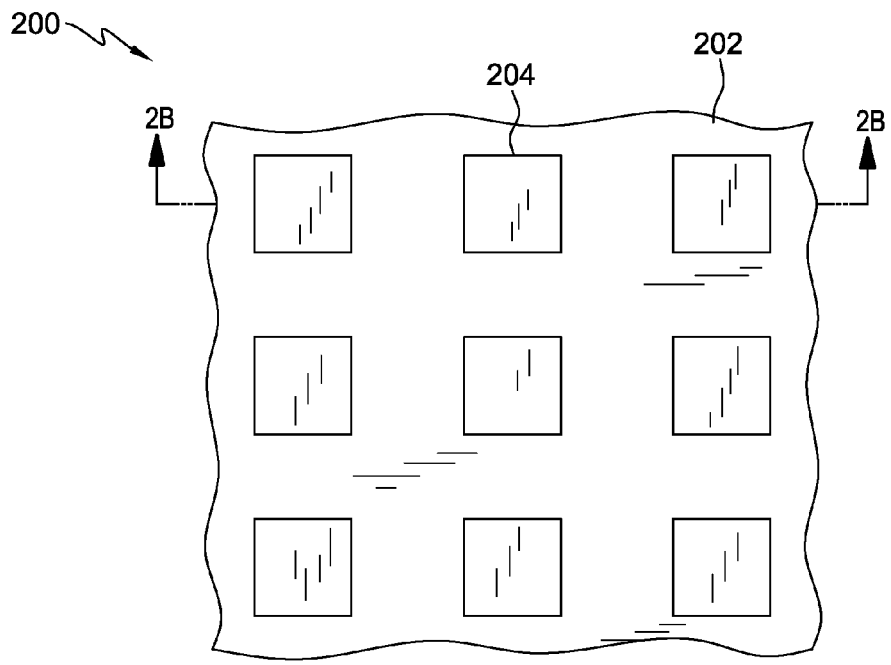
FIG. 2A is one example of a mask having arrayed etched regions for producing an arrayed via layout on a wafer.
Figure 2B:
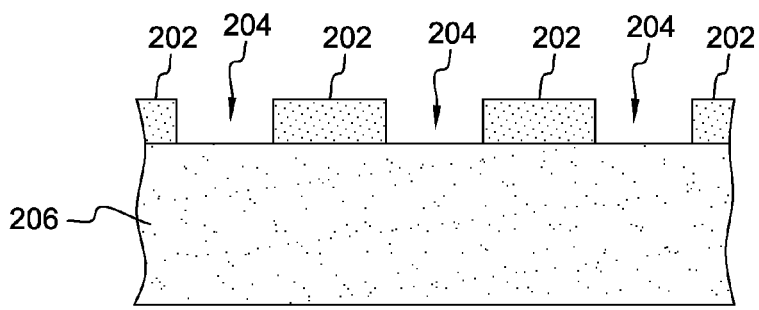
FIG. 2B is a cross-sectional side view of the mask of FIG. 2A taken along line 2A-2A'.

A conventional mask having arrayed etched regions for producing an arrayed via layout on a wafer is depicted and described with reference to FIGS. 2A and 2B. FIG. 2A depicts a top view of mask 200. Mask 200 includes opaque material 202 deposited over a translucent substrate 206 (FIG. 2B). Regions 204 are etched into opaque material 202 to create a plurality of etched regions 204 arrayed in two directions (vertically and horizontally in this example). Mask 200 depicts only nine etched regions 204, but a typical mask may include many hundreds or thousands of such etched regions.

The etching of regions 204 typically involves chemically and/or mechanically removing portions of opaque material 202 to expose a surface of the underlying translucent substrate. This is illustrated in FIG. 2B which depicts a cross-sectional side view of mask 200 taken along line 2A-2A'. The cross-section depicts regions 204 etched through opaque material 202 to translucent substrate 206. Etched regions 204 are separated by opaque material 202.

As light is introduced to mask 200 (e.g. vertically from above the mask), the light incident on opaque material 202 will be substantially blocked from passing through substrate 206 to the photoresist area of the wafer, while light passing through etched regions 204 and incident on the exposed portion of substrate 206 will pass through substrate 206 to the photoresist area. The exposure will form a corresponding pattern of vias in the photoresist area of the wafer.

Figure 2C:
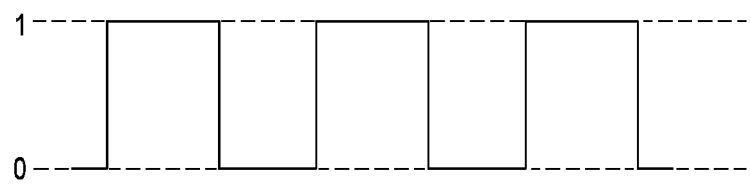
FIG. 2C is a schematic representation of the intensity profile of light passing through the mask of FIG. 2A, taken along line 2A-2A'.

Light intensity will vary across portions of the wafer depending on whether those portions were exposed or not to light passing through the substrate. FIG. 2C is a schematic representation of the intensity profile of light passing through mask 200 of FIG. 2A, taken along line 2A-2A'. The intensity profile is shown to vary in a binary fashion between 0 and 1 for simplicity, with the 0 indicating areas (such as directly beneath the opaque material 202) experiencing no, or relatively little, light exposure, and the 1 indicating areas (such as beneath the etched regions 204) experiencing intense, or relatively high, light exposure. Ignoring the effects of diffraction, an appropriate 'shadow' corresponding to mask 200 will be projected to the wafer being patterned.

In practice, however, light incident upon the various areas of the resist layer of the wafer is impacted by diffracted light from edges between the etched areas and the opaque areas of the mask. By decreasing the distances between the opaque areas, small apertures are formed which diffract the light that passes through the apertures. The diffracted light results in effects that tend to spread or to bend the light as it passes through the mask, so that the space between the two opaque areas is not resolved. This makes diffraction a limiting factor for optical photolithography since the light/dark contrast of the 'shadow' being projected is negatively impacted. This becomes more problematic as the pitch (on-center spacing) between etched regions of the mask decreases to accommodate more tightly-arranged features to be printed on the wafer.

A way of dealing with the effects of diffraction is through light phase-shifting, as is appreciated by those having ordinary skill in the art. In phase-shifting, the mask is fabricated so as to cause a phase shift in some of the light passing through the translucent substrate. Interference between light waves is reduced when those waves are out-of phase. So, when the phase of light exposing one region of the wafer is shifted from the phase of light exposing an adjacent region, the interference is minimized, contrast is improved, and the resolution capability achievable using the mask is increased.

Varying the thickness of the mask substrate in some translucent regions of the mask is one way of causing such a phase shift. Regions of varying depth can be etched onto a frontside of a mask to introduce varying degrees of phase shift in the light passing through the substrate thereof. With reference again to FIGS. 2A and 2B, some regions 204 may extend into a portion of the underlying substrate 206, decreasing the thickness of substrate 206 under that etched region 204 and introducing a shift in phase relative to the light passing through other (thicker) areas of the substrate under other etched regions thereof.

Figure 3A:
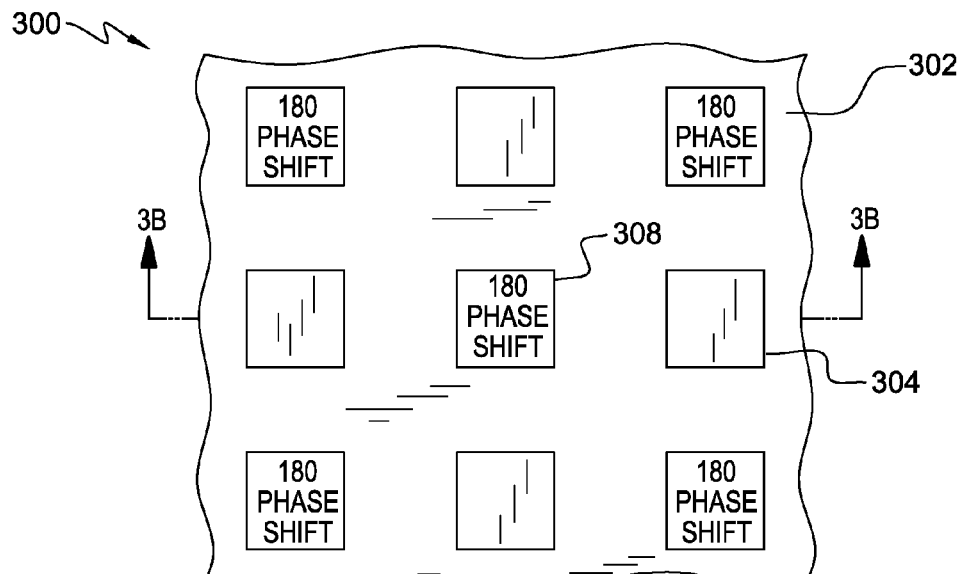
FIG. 3A is one example of a mask in accordance with one or more aspects of the present invention.

In accordance with an aspect of the present invention, a mask is provided having a plurality of first and second phase shift regions. In one example, the first phase shift regions are disposed on a first side of the mask by etching the first side, while the second phase shift regions are disposed on a second side of the mask by etching the second side. FIG. 3A depicts one example of a mask in accordance with one or more aspects of the present invention.

Phase shift mask 300 includes opaque material 302, such as molybdenum silicon nitride (MoSiN), deposited over translucent substrate 306 (FIG. 3B), such as quartz. First phase shift regions 304 are arrayed and aligned in two directions—vertically and horizontally in this diagram—as are second phase shift regions 308. Second phase shift regions are 180 degree phase shift regions in this example, however second phase shift regions 308, like first phase shift regions 304, could have any desired phase shift.

Figure 3B:
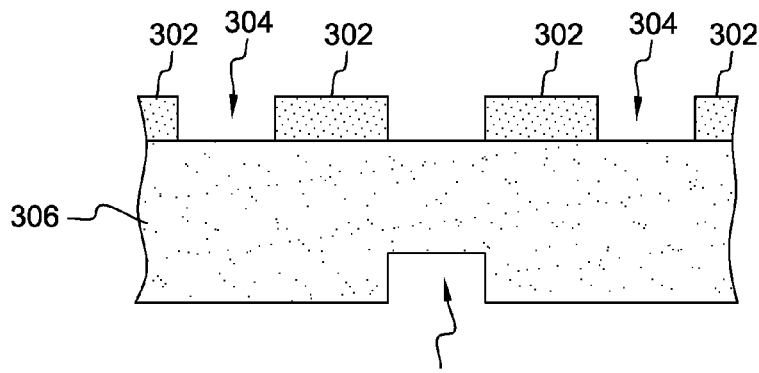
FIG. 3B is a cross-sectional side view of the mask of FIG. 3A taken along line 3A-3A'.

FIG. 3B shows a cross-sectional side view of mask 300 of FIG. 3A taken along line 3A-3A'. First phase shift regions 304 are disposed (e.g. by etching) on the side of the mask on which opaque material 302 is deposited. For convenience, this side of mask 300 is referred to as the frontside of the mask. The frontside of the mask is additionally etched between first phase shift regions 304, and vertically above second phase shift regions 308. Etching the frontside of the mask above second phase shift regions 308 exposes the substrate above second phase shift regions 308 in order to enable light to pass through the mask and second phase shift regions 308. Second phase shift regions 308 are disposed (by etching) on the opposite side (e.g. backside) of the mask, in this example. Etching second phase shift regions 308 into the backside of the substrate 306 provides a thinner area of translucent substrate at the second phase shift regions 308 than at the first phase shift regions 304. Consequently, phase shift regions 304 and 308 will have (i.e. produce) different shifts in the phase of light when light passes therethrough; that is, the phase shift produced by second phase shift regions 308 will differ from phase shift produced by the first phase shift regions 304.

In one example, it may be desired for the phase shift of first phase shift regions 304 to be 180 out of phase with the phase shift of second phase shift regions 308. In particular, first phase shift regions 304 may have a 0 degree (or substantially no) phase shift, meaning no shift in phase is introduced by that regions as light passes through the substrate at that region. A phase shift region producing no (or substantially no) phase shift may also be referred to as a "non-phase shift region". Additionally or alternatively, second phase shift regions 308 may have a 180 degrees (or substantially 180 degrees) phase shift. Thus, in one particular example, first phase shift regions 304 may be formed so as to produce no (i.e. 0 degree) phase shift while second phase shift regions 308 may be formed so as to produce a 180 degrees phase shift. The 180 degrees difference in phase between first and second phase shift regions, 304 and 308 respectively, will maximize the cancelling effect and minimize interference between light waves coming from first phase shift regions 304 and light waves coming from second phase shift regions 308.

Though FIG. 3A depicts only nine phase shift regions, it is understood, as noted above, that a typical mask may include many hundreds or thousands of such phase shift regions.

Additionally with respect to FIG. 3A, it is seen that adjacent first phase shift regions 304 are spaced apart not only by areas of opaque material 302 on the frontside of the mask, but also by second phase shift regions 308 on the backside of the mask. Similarly, adjacent second phase shift regions 308 on the backside of the mask are spaced apart by opaque material 302 and first phase shift regions 304, both on the frontside of mask 300.

Figure 3C:
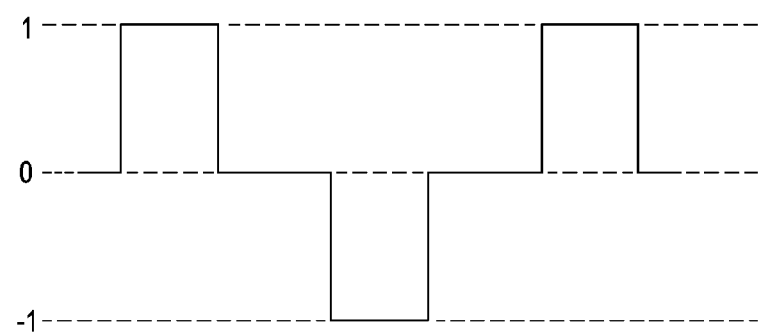
FIG. 3C is a schematic representation of the intensity profile of light passing through the mask of FIG. 3A, taken along line 3A-3A'.

FIG. 3C is a schematic representation of the intensity profile of light passing through the mask of FIG. 3A, taken along line 3A-3A'. The intensity profile varies between −1, 0, and 1, accounting not only for the presence or absence of light, but also for the difference in the phase of light passing through first phase shift regions 304 and the phase of light passing through second phase shift regions 308. The intensity profile of FIG. 3C is produced when first phase shift regions 304 are 180 degrees out of phase of second phase shift regions 308 (i.e. the difference in the phase of light passing through regions 304 and the phase of light passing through regions 308 is 180 degrees). In that case, a 1 indicates areas (such as beneath etched regions 304) experiencing intense, or relatively high, light exposure, a 0 indicates areas (such as directly beneath the opaque material 302) experiencing no, or relatively little, light exposure, and a −1 indicates areas (such as beneath etched regions 308) experiencing intense, or relatively high, light exposure by light that is 180 degrees out-of-phase from the light passing through first phase shift regions 304.

Resolution capability of the mask of FIG. 3A is increased by 2× due to the higher contrast potential between the first phase shift regions (intensity of 1) and the second phase shift regions (intensity of −1). From a layout perspective, the additional contrast allows spacing between phase shift regions (and therefore the spacing between the vias formed on the wafer) to be decreased, thereby increasing the resolution achieved using the mask. Further detail is provided below with reference to FIGS. 6A and 6B.

In accordance with the present invention, and in contrast to conventional techniques of etching only a single side of the mask, a second side of the mask (for instance, the underside of the substrate) is etched in order to introduce the desired phase shift of the second phase shift regions. One advantage to etching the backside of the mask is that fewer process steps, as compared to a multiple reticle configuration, are needed in the fabrication of the mask and during the lithographic process to expose a wafer. Alternating phase shift regions are provided using only a single mask, and vias can be formed from a single exposure using that single mask. This is advantageous over, for instance, the double reticle processes where two reticles are fabricated and utilized in a double-patterning process.

Figure 4:
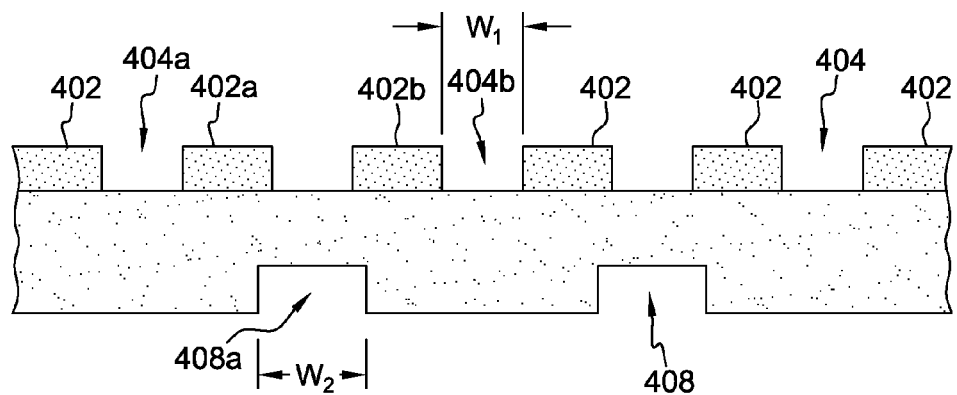
FIG. 4 is a cross-sectional side view of a mask having phase shift regions of differing width, in accordance one or more aspects of the present invention.

Also, greater leeway is afforded for deviation from the critical dimensions of the second phase shift region etches on the backside. This is illustrated in FIG. 4, which depicts a cross-sectional side view of a mask having phase shift regions of differing width, in accordance one or more aspects of the present invention. In this example, first phase shift regions 404 are disposed as etches of width $W_1$, while second phase shift regions 408 are disposed as etches of width $W_2$. First phase shift regions 404 and the openings above second phase shift regions 408 are etched with relatively high precision having width $W_1$, for instance, because the light strikes the mask from above (in this diagram). Since the light is incident on the frontside of the mask having opaque blocking material 402, the second phase shift regions 408 can be etched wider than these etchings above second phase shift regions 408. There is more tolerance for error when etching the backside of the mask in this case because the opaque material above will serve as a mask for blocking light outside of that opening. Provided that the etching on the backside of the mask does not extend to directly beneath any first phase shift region 404, the second phase shift regions 408 can be purposely oversized (i.e. $W_2$) to hedge against possible failure conditions in meeting the target $W_2$; so long as second phase shift region 408 is at least as wide as $W_1$ and is narrow enough that it does not extend beneath any first phase shift region 404, this is acceptable. In this regard, there are, in one embodiment, upper and lower bounds on the width $W_2$ of a second phase shift region 408a. The lower bound is the width ($W_1$ in the example of FIG. 4) of the frontside opening directly (vertically) above second phase shift region 408a (i.e. between the right edge of opaque material 402a and left edge of opaque material 402b). The upper bound is the distance between the right edge of first phase shift region 404a and the left edge of first phase shift region 404b. In the depiction of FIG. 4, then, second phase shift region 408a could extended from below the right edge of first phase shift region 404a to below the left edge of first phase shift region 404b. In this manner, there is more tolerance in fabrication of the backside etchings (408) than fabrication of the frontside etchings (404). The backside etchings might be wider or misaligned (off-center between opaque material 402a and 402b), as examples, without affecting the efficacy of the second phase shift regions.

Figure 5:
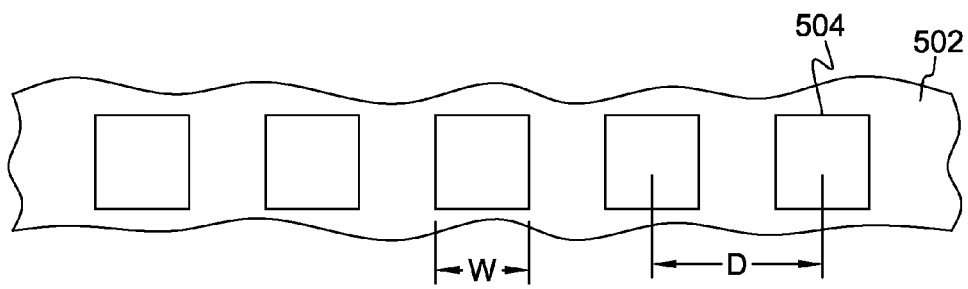
FIG. 5 depicts a portion of a mask showing etched regions having a width and pitch thereof.

As noted above, the additional contrast afforded by aspects of the present invention advantageously enables the spacing between phase shift regions to be reduced. To illustrate, and turning to FIG. 5, depicted is a portion of a mask showing etched regions having a width and pitch thereof. Mask 502 includes multiple etched regions 504 having width, W, and being spaced apart by distance, D (D is the "pitch" between etched regions 504). Aspects of the present invention advantageously provide resolution enhancement that enables, for instance, pitch between phase shift regions to be reduced and/or phase shift regions size increased, which is directly proportional to an decrease in pitch and increase in feature size of features (e.g. vias) printed on a wafer. Such pitch and size enhancements thereby increase coverage area of the array of vias produced using the mask.

Figure 6A:
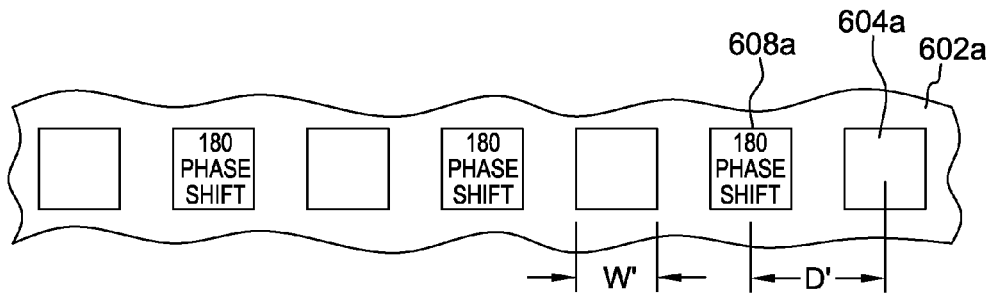
FIG. 6A depicts an example of improved pitch achieved using a mask in accordance with one or more aspects of the present invention.

The minimum pitch of the vias produced using a mask in accordance with aspects of the present invention can be reduced by as much as 50% in some cases. FIG. 6A depicts an example of improved pitch achieved using a mask according to one or more aspects of the present invention. By way of example and not limitation, first phase shift regions 604a of FIG. 6A are 0 degrees phase shift regions of a mask and second phase shift regions 608a are 180 degrees phase shift regions of the mask. In this case, width W' of phase shift regions 604a and 608a remains the same compared with FIG. 5, but pitch between adjacent regions (of differing phase shift) is reduced. Pitch D' of FIG. 6A is smaller than pitch D from FIG. 5, where first and second phase shift regions, 504a and 508a respectively, are spaced closer together without adversely affecting contrast. This is because of the cancellation effects due to the differences in phase between light passing through first phase shift regions 604a and light passing through second phase shift regions 608a, as explained above.

Figure 6B:
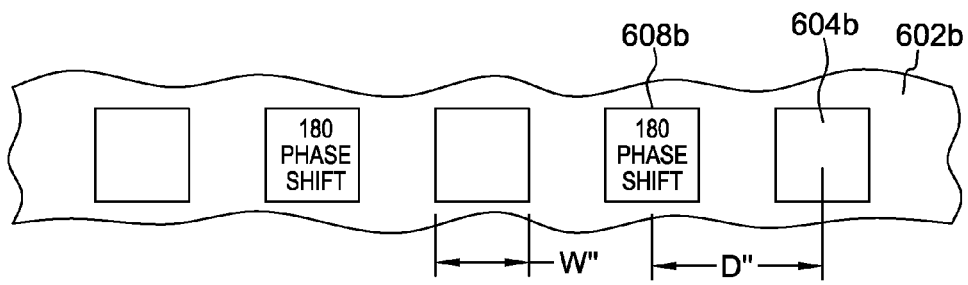
FIG. 6B depicts an example of increased etch size achieved using a mask in accordance with one or more aspects of the present invention.

FIG. 6B illustrates increased etch size for resolution enhancement. Again by way of example and not limitation, first phase shift regions 604b of FIG. 6B are 0 degrees phase shift regions of a mask and second phase shift regions 608b are 180 degrees phase shift regions of the mask. In this example, pitch remains the same as in FIG. 5 (D"=D). First phase shift regions 604b and second phase shift regions 608b are made larger (W"), thus increasing the coverage area of vias produced by these phase shift regions. In a further embodiment, both pitch and feature size can be modified (i.e. pitch is decreased, and size of first and second phase shift regions is increased) in combination, in order to increase via coverage area.

In alternative embodiments, the first and second phase shift regions may be, if desired, etched onto a same side of the mask. In such a configuration, the second phase shift regions are disposed between first phase shift regions on the frontside of the mask by etching the second phase shift regions into the substrate on the frontside instead of etching on the backside of the mask. The configuration produced is the checkerboard pattern as depicted in FIG. 3A, which the difference being that second phase shift regions are disposed on the frontside rather than the backside, and are disposed as deeper etches (in one example) in the frontside of the mask than the etches forming the first phase shift regions in the frontside of the mask.

An increase in the coverage area of vias produced using a single mask, in accordance with aspects of the present invention, is advantageously provided. Whereas conventional approaches use two or more reticles to minimize pitch and/or maximize feature size, aspects of the present invention advantageously enable such enhancements using a single mask.

Aspects of the present invention additionally include methods for fabricating a mask having the configuration(s) described above, and methods for semiconductor device fabrication using such a mask. Accordingly, a mask fabrication method may include forming multiple first phase shift regions disposed on a first side of the mask, and forming a plurality of second phase shift regions disposed on a second side of the mask, as described above. Additionally, a semiconductor device fabrication may include procuring a mask as described above and subjecting the mask to an exposure of electromagnetic radiation using, for instance the technique described above with reference to FIG. 1, to print vias onto a substrate of the semiconductor device.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A mask comprising:
   a plurality of first phase shift regions disposed on a first side of the mask; and
   a plurality of second phase shift regions disposed on a second side of the mask, wherein each second phase shift region of the plurality of second phase shift regions is centered in alignment with a respective gap between opaque regions disposed on the first side of the mask, the gap and opaque regions separating adjacent first phase shift regions of the plurality of first phase shift regions.

2. The mask of claim 1, wherein a phase shift of the plurality of first phase shift regions is out of phase with a phase shift of the plurality of second phase shift regions.

3. The mask of claim 2, wherein the phase shift of the plurality of first phase shift regions is approximately 180 degrees out of phase with the phase shift of the plurality of second phase shift regions.

4. The mask of claim 1, wherein a first phase shift region of the plurality of first phase shift regions has a zero degree phase shift.

5. The mask of claim 1, wherein a second phase shift region of the plurality of second phase shift regions has a 180 degrees phase shift.

6. The mask of claim 1, wherein the plurality of first phase shift regions and the plurality of second phase shift regions are aligned in at least one direction across the mask, and spaced apart in an alternating fashion in the at least one direction across the mask.

7. The mask of claim 6, wherein the plurality of first phase shift regions and the plurality of second phase shift regions are aligned in a first direction and a second direction orthogonal to the first direction.

8. The mask of claim 1, wherein the first side comprises a frontside of the mask and the second side comprises a backside of the mask, and wherein the plurality of first phase shift regions are formed by etching the frontside of the mask and the plurality of second phase shift regions are formed by etching the backside of the mask.

9. The mask of claim 1, wherein a width of the plurality of second phase shift regions is greater than a width of the plurality of first phase shift regions.

10. The mask of claim 1, wherein first phase shift regions of the plurality of first phase shift regions and second phase shift regions of the plurality of second phase shift regions are spaced apart by an opaque material deposited on the first side of the mask.

11. The mask of claim 10, wherein the opaque material is disposed over a first side of a translucent substrate, and wherein the plurality of second phase shift regions are formed by etching a second side of the translucent substrate.

12. The mask of claim 1, wherein a pair of opaque regions reside adjacent a gap with which a second phase shift region of the plurality of second phase shift regions is in center-alignment, and wherein the second phase shift region extends in a first direction past a center of one opaque region of the pair of opaque regions.

13. The mask of claim 12, wherein the second phase shift region extends in a second direction past a center of the other opaque region of the pair of opaque regions.

14. A method comprising:
   forming a plurality of first phase shift regions disposed on a first side of a mask; and
   forming a plurality of second phase shift regions disposed on a second side of the mask, wherein each second phase shift region of the plurality of second phase shift regions is centered in alignment with a respective gap between opaque regions disposed on the first side of the mask, the gap and opaque regions separating adjacent first phase shift regions of the plurality of first phase shift regions.

15. The method of claim 14, wherein a phase shift of the plurality of first phase shift regions is out of phase with a phase shift of the plurality of second phase shift regions.

16. The method of claim 14, wherein forming the plurality of first phase shift regions and forming the plurality of second phase shift regions comprises aligning the plurality of first phase shift regions and the plurality of second phase shift regions in at least one direction across the mask, and spacing apart the plurality of first phase shift regions and the plurality of second phase shift regions in an alternating fashion in the at least one direction across the mask.

17. The method of claim 14, wherein the first side comprises a frontside of the mask and the second side comprises a backside of the mask, and wherein forming the plurality of first phase shift regions comprises etching the frontside of the mask, and forming the plurality of second phase shift regions comprises etching the backside of the mask.

* * * * *

UNITED STATES PATENT AND TRADEMARK OFFICE
CERTIFICATE OF CORRECTION

PATENT NO.         : 8,895,211 B2
APPLICATION NO.    : 13/710498
DATED              : November 25, 2014
INVENTOR(S)        : Ning et al.

Page 1 of 1

It is certified that error appears in the above-identified patent and that said Letters Patent is hereby corrected as shown below:

On the title page item (73): Delete "Globalfoundries, Inc., Santa Clara, CA (US)" and insert
-- GlobalFoundries Inc., Grand Cayman, (KY) --

Signed and Sealed this
Twenty-fourth Day of March, 2015

Michelle K. Lee
*Director of the United States Patent and Trademark Office*